United States Patent [19]

Burkman

[11] Patent Number: 4,609,575

[45] Date of Patent: Sep. 2, 1986

[54] METHOD OF APPARATUS FOR APPLYING CHEMICALS TO SUBSTRATES IN AN ACID PROCESSING SYSTEM

[75] Inventor: Don C. Burkman, Excelsior, Minn.

[73] Assignee: FSI Corporation, Chaska, Minn.

[21] Appl. No.: 626,640

[22] Filed: Jul. 2, 1984

[51] Int. Cl.⁴ .................. B05B 13/02; B05B 15/06
[52] U.S. Cl. .................. 427/426; 118/326; 156/640; 156/345
[58] Field of Search .................. 118/326; 427/426; 156/640, 662, 345; 134/3, 95, 99, 140, 153

[56] References Cited

U.S. PATENT DOCUMENTS

| | | | |
|---|---|---|---|
| 2,249,205 | 7/1941 | Hansen | 427/426 X |
| 2,956,900 | 10/1960 | Carlson et al. | 427/426 X |
| 3,027,869 | 4/1962 | Ball | 118/326 |
| 3,673,042 | 6/1972 | Mayers | 156/345 |
| 4,161,356 | 7/1979 | Giffin et al. | 156/345 |
| 4,286,541 | 9/1981 | Blackwood | 134/153 X |
| 4,425,868 | 1/1984 | Shapiro | 118/326 X |

FOREIGN PATENT DOCUMENTS

| | | | |
|---|---|---|---|
| 2923906 | 5/1980 | Fed. Rep. of Germany | 118/326 |
| 146574 | 12/1978 | Japan | 156/640 |

Primary Examiner—Shrive P. Beck
Attorney, Agent, or Firm—Palmatier & Sjoquist

[57] ABSTRACT

In acid processing of substrates, such as silicon wafers in the manufacture of electronic devices, such as integrated circuit chips, the method of mixing separate chemicals together in the processing chambers and as the separate chemicals are sprayed in atomized and directional spray patterns toward and across the surfaces of the substrates, the directional spray patterns emanating from different sources and having oblique directions with respect to each other to traverse each other at the surfaces of the substrates for thorough mixing and immediate application to the wafer faces to accomplish the processing. A vented housing defines the processing chamber with spray posts spaced from each other around the periphery of the housing and mounted on the sidewall and directing atomized liquid chemical sprays toward the center at which the substrates are mounted as to cause the spray patterns to traverse each other as they sweep across the wafers.

12 Claims, 8 Drawing Figures

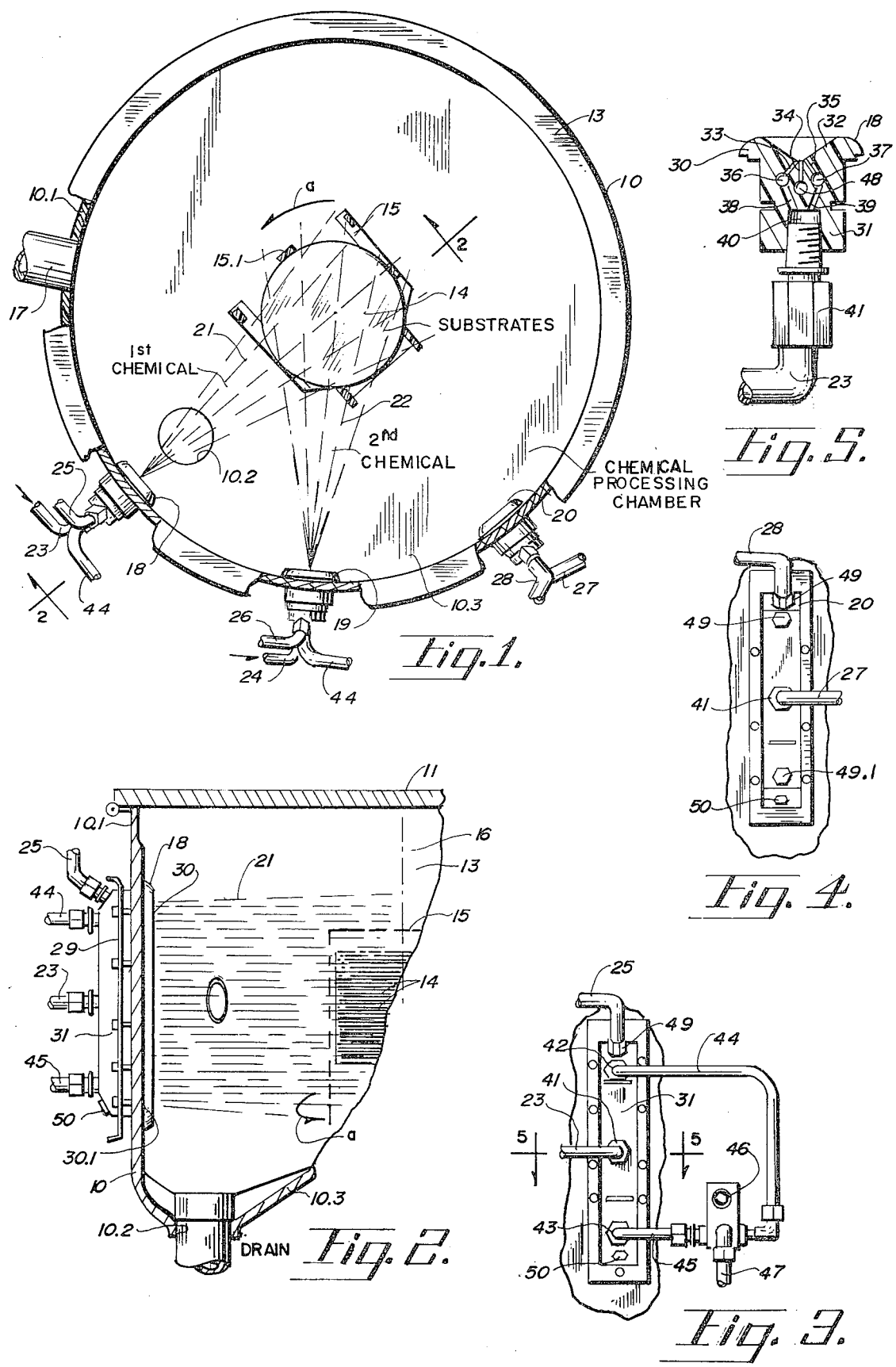

4,609,575

METHOD OF APPARATUS FOR APPLYING CHEMICALS TO SUBSTRATES IN AN ACID PROCESSING SYSTEM

BACKGROUND OF THE INVENTION

This invention relates to an acid processing system for processing substrates such as silicon wafers in the manufacture of electronic devices, such as integrated circuit chips, and more specifically to the application of a mixture of chemicals to such substrates.

In the manufacture of electronic devices such as integrated circuit chips, an acid processing system is used for processing the substrates such as silicon wafers. The processing of such substrates is a multistep operation and, depending upon the actual processes being carried out, a number of different chemicals are sequentially applied, as by spraying, to the substrates; and each chemical processing step is preceded and followed by a rinsing step using a rinsing liquid, such as water. During certain of the processing steps during which liquid chemicals are being applied to the substrates or wafers, two or more different liquid chemicals are applied to the substrates simultaneously. In the known processes, the procedures followed have required that the liquid chemicals be mixed, as in a mixing chamber, located along the supply lines which supply chemicals to the spray post directing the liquid chemicals onto the substrates in the processing chamber.

Some of the chemicals which are mixed together and used in such chemical processing steps for such substrates are highly active and dangerous to handle, especially when mixed with other highly active chemicals. For instance, ammonium hydroxide must be mixed with nitric acid in certain steps involved in the processing of such substrates. In other processing steps, concentrated hydrochloric acid is mixed with hydrogen peroxide. These mixtures of highly active chemicals are typical of those which create dangerous conditions during the mixing of such chemicals together as they are supplied to the processing chamber for spraying onto the substrates.

Other chemicals that must be mixed together in certain processing steps are of a nature as to degrade very quickly and loose their effectiveness shortly after they are mixed together. For instance, ammonium hydroxide is mixed with hydrogen peroxide in certain processing steps, and if this chemical mixture is not applied to the substrates almost instantaneously after mixing, it will begin to degrade with lesser effectiveness, thus affecting the process being carried out.

SUMMARY OF THE INVENTION

An object of the invention is to provide for improved mixing of highly active chemicals used in the processing of substrates in an acid processing to assure the presence of full strength chemicals at the face of the substrate, thereby enhancing the removal of contaminants or other chemical layers at the substrate face.

A feature of the invention is the supplying of individual highly active chemicals to separate spray posts in a processing chamber from which the separate chemicals are sprayed and atomized and directed onto the substrates being processed. The two separate chemicals being simultaneously sprayed and atomized from the two separate spray posts are mixed thoroughly together as they are applied directly to the faces of the substrates. Because of the thorough intermixing of the atomized chemicals being sprayed from different angles onto the faces of the substrates, the chemicals are thoroughly mixed and their full strength is maintained to the instant of usage of these chemicals on the face of the substrates. The spray posts are located on the peripheral wall of the processing chamber and the sprays of atomized liquid chemicals are directed at oblique angles with respect to each other so that the sprays of chemicals traverse each other at the faces of the wafers, thereby obtaining thorough mixing.

The mixing of the highly active chemicals at the face of the substrates or wafers as the chemicals are being applied to the substrates provides a substantial advantage in that the reactivity of the chemical mix enhances the removal of contaminants or other chemical layers from the substrates. The mixing of these highly active chemicals in the processing chamber reduces the danger of any violent reaction between the chemicals because the processing chamber is vented and prevents the formation of any excessive pressures or temperatures during the mixing of the highly active chemicals. In addition, the mixing of the chemicals as they are atomized and sprayed from separate spray posts onto the substrates causes the chemicals to be mixed together at the last possible moment as they are applied to the faces of the substrates, thereby retaining the full strength and effectiveness of the chemicals to produce the desired processing of the substrates.

BRIEF DESCRIPTION OF THE DRAWINGS

FIG. 1 is a plan view of a processing chamber with the cover removed and illustrating the present invention.

FIG. 2 is a detail section view taken at 2—2 of FIG. 1, with the cover in place.

FIG. 3 is an enlarged detail elevation view of one of the spray posts and its piping connections.

FIG. 4 is a detail elevation view of the rinsing spray post and its piping connections.

FIG. 5 is an enlarged detail section view taken approximately at 5—5 of FIG. 3.

DETAILED SPECIFICATION

Figure 6:
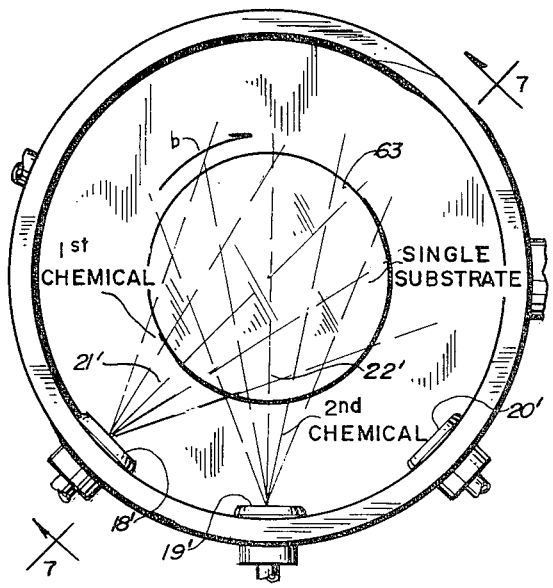
FIG. 6 is a top plan view looking into the processing chamber illustrating a modified form of the invention, the view being taken substantially at 6—6 of FIG. 7.

One form of the invention is illustrated in FIGS. 1–5, together with the schematic drawing of FIG. 8, and a second modified form is illustrated in connection with FIGS. 6 and 7.

A stainless steel bowl or housing 10 has a cover 11 which may be swung open, define a processing chamber 13 for carrying out the acid processing of substrates 14 which are confined and spaced from each other and located in a carrier 15 at the center of the chamber 13. The substrates are in most cases silicon wafers, and are being processed in the acid process during the manufacture of integrated circuit chips which are ultimately formed from the wafers 14. The wafers are maintained in confronting spaced and aligned relation with each other, substantially concentric with the rotation axis about which they are rotated as indicated by arrow a.

The carrier 15 is an open framework with spacing ribs between the individual wafers 14. A retainer bar or rod 15.1 traverses the open side of the carrier to retain the wafers in the carrier during rotation.

In FIG. 2, the axis of rotation of the wafers and carrier 15 is illustrated and indicated by the numeral 16.

The bowl 10 has a vent tube 17 opening through the sidewall 10.1 thereof; and the bowl also has a drain 10.2 opening through the bottom wall 10.3 upon which all of the liquids sprayed into the chamber 13 are collected and drained to the open drain 10.2.

A plurality of spray posts or heads 18, 19 and 20 are mounted in slot-like openings in the sidewall 10.1 of the bowl, and are spaced from each other about the periphery of the bowl. The spray posts 18 and 19 are dedicated to spraying liquid chemicals into the processing chamber 13 and across and onto the wafers 14. It is important that the liquid chemical spray posts 18 and 19 be widely spaced from each other about the periphery of the bowl so that the general direction of the two spray patterns 21 and 22 emanating therefrom are at an oblique angle with respect to each other. The angle between the general direction of the spray patterns 21, though not highly critical, has been found to be successful for the purpose of the present invention at 45°. The angle between the spray patterns may vary over a wide range, as from 20 to 120° or more. It is important that the two spray patterns 21 and 22 from the separate liquid chemical spray posts 18 and 19 traverse each other as they sweep across the faces of the wafers 14. Because of this transverse projection of the two spray patterns 21 and 22, relative to each other, the two liquid chemicals from the separate spray posts 18 and 19 will be thoroughly mixed as they are being applied to the wafers 14.

The two separate liquid chemicals are supplied to the spray posts 18 and 19 by supply lines or pipes 23 and 24, respectively. The spray nozzles 18 and 19 also perform an atomizing function utilizing an inert gas, such as nitrogen under pressure, and supplied to the spray posts 18 and 19 by supply lines or pipes 25 and 26, respectively, to break up the spray particles of liquid chemical and effectively atomize the liquid chemical sprays emanating under substantial intensity and with the direction indicated to produce the spray patterns 21 and 22 of the atomized spray, which is almost fog-like, but with a high degree of intensity and directionality.

As a result of the merging sprays in the patterns 21 and 22 and from the respective spray posts 18 and 19, the atomized liquid chemical sprays thoroughly mix with each other with turbulence as the atomized sprays engage and sweep over the faces of the wafers to process all portions of the faces of the separate wafers.

The spray post 20 is dedicated to spraying rinsing water onto the substrates between the several process steps in the overall process and while the sprays from nozzles 18 and 19 are terminated for purpose of cleaning out the chemical spray posts, supply lines, and for changing to different chemicals. Rinsing water is supplied to the spray post 20 in the supply line 27; and inert gas, such as nitrogen under pressure, is supplied through supply line or pipe 28 to the spray post 20 for atomizing the rinsing water in order to thoroughly drench and rinse the substrates 14 being processed.

More specifically with respect to the spray posts 18, 19 and 20, all of the spray posts are essentially the same, and an understanding of one spray post will suffice for an understanding of all of the spray posts. Only the exterior piping and connections are changed as between the liquid chemical spray posts 18, 19 and the rinsing water spray post 20. The spray post 18 has mounting brackets 29 for attaching the spray post to the bowl wall 10.1. A front mounting flange 30, together with a gasket 30.1, bears against the inner face of the bowl wall 10.1, and the rear portion 31 of the spray post protrudes through the bowl wall and accommodates the mounting of the supply lines outside the processing chamber 13.

The spray post 18 is formed of an inert plastic, highly resistant to the highly active chemicals which are sprayed through it, and it has been found successful to form the spray post 18 of a plastic known as tetrafluoroethylene, a fluorocarbon material, generally referred to by its trademark Teflon, of the duPont Company, Wilmington, Del.

The front face 32 of the spray post 18 has three sets of orifices 33, 34 and 35 opening therethrough. The orifices 33 and 35 will carry liquid chemical and are supplied from manifolds 36 and 37 extending the full length of the spray post body 31. The manifolds intersect and communicate with the orifices 33 and 35, and also intersect and communicate with supply ducts 38 and 39 which open into ports 40, disposed at both upper and lower ends of the spray post body and intermediate its ends, into which fittings 41, 42 and 43 are threaded. The upper and lower fittings 42 and 43 are respectively connected with drain pipes 44 and 45 which supply a solenoid operated drain valve 46 which connects to an open drain 47 to accommodate rinsing the manifolds 36 and 37 and the supply line 23.

The spray post body also has a gas manifold 48 extending throughout the length of the spray post body and intersecting with the gas jetting orifices 34; and the gas manifold 48 receives a fitting 49 in its upper end for connection to the supply line 28.

In the rinsing water spray post 20, the supply fitting 41 is connected to the rinse water supply line 27; and in the rinse water spray post, the other ports 40 are closed by plugs 49.1.

In all of the spray posts 18, 19 and 20, the lower ends of the gas manifolds 48 are closed by plugs 50.

Figure 8:
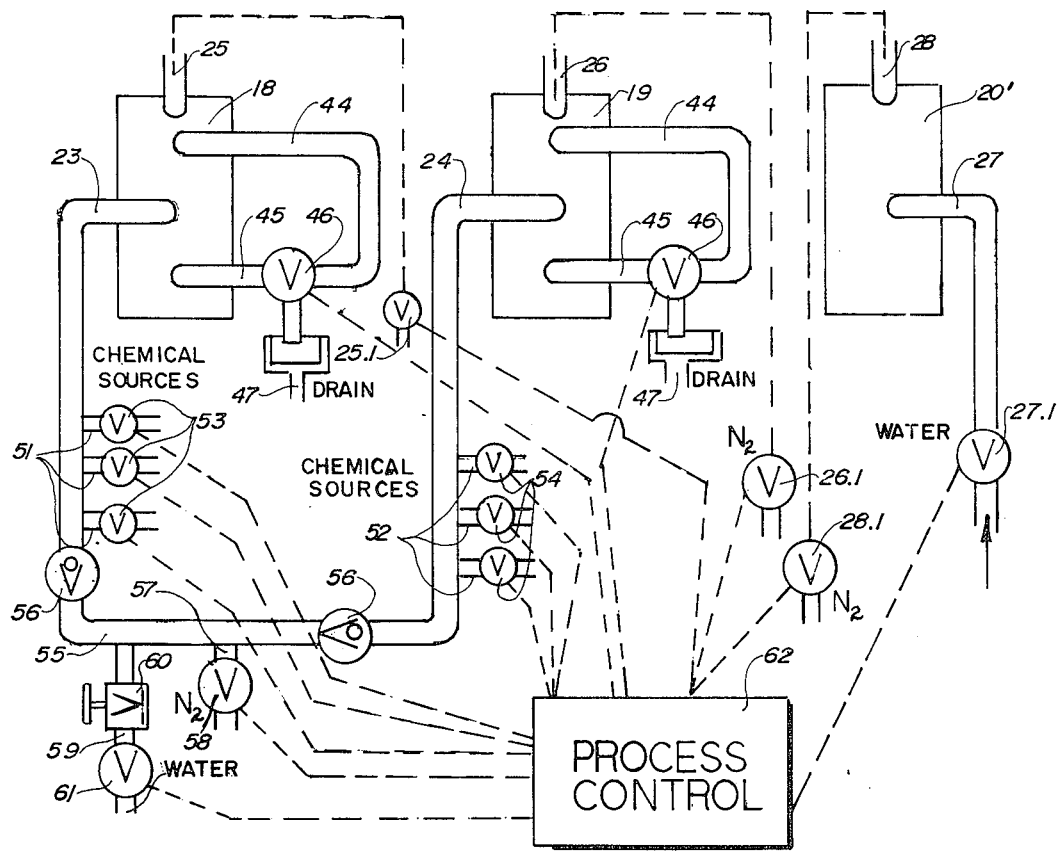
FIG. 8 is a schematic diagram of the flow connections and piping supplying liquid chemicals and rinsing water to the spray post of the processing chamber.

In the schemtic diagram of FIG. 8, it will be recognized that each of the chemical supply lines 23 and 24 is connected to a number of chemical source lines 51 and 52, each of which is controlled by an on-off valve 53, 54, so that three different chemical sources may be selectively connected to the supply line 23, and three more selective chemical sources may be connected to the supply line 24. Chemicals which are to be mixed together as they traverse the substrates 14 in the chamber will be supplied through separate supply lines 23, 24. For instance, if ammonium hydroxide and nitric acid are to be mixed together as they are applied to the substrates 14, the ammonium hydroxide will be connected to one of the source lines 51 for supply through the chemical supply line 23 to spray post 18, and the nitric acid will be connected to one of the source lines 52 to be controlled by one of the valves 54 for supply through the chemical supply line 24 to the spray post 19.

Similarly, if hydrochloric acid is to be mixed with hydrogen peroxide as they sweep across and are applied onto the substrates 14, the hydrochloric acid will be connected to one of the source lines 53 and controlled by the certain valve 53; and the hydrogen peroxide will be supplied through one of the source lines 52 and controlled by its respective valve 54.

Nitrogen to the several supply lines 25, 26 and 28 is controlled by separate valves 25.1, 26.1 and 28.1. Rinsing water to the rinsing water supply line 27 is controlled by an on-off valve 27.1.

A manifold pipe 55 connects between the two chemical supply lines 23, 24 with check valves 56 therebetween to prevent reverse flow of chemicals. A gas source line 57, controlled by gas valve 58, supplies inert gas, such as nitrogen, into the manifold line 55 and supply lines 23, 24 for purging them during a rinse cycle. A rinsing water source line 59 is also connected to the manifold line 55 through a needle valve or flow restriction 60, and is controlled by an on-off water valve 61, for providing rinsing water to the supply lines 23, 24 and to the spray posts 18, 19. A central process control 62 controls all the valves in the system which are all solenoid valves and may be electrically controlled, except for the needle valve 60 which is manually operated for regulating the flow of rinsing water.

Figure 7:
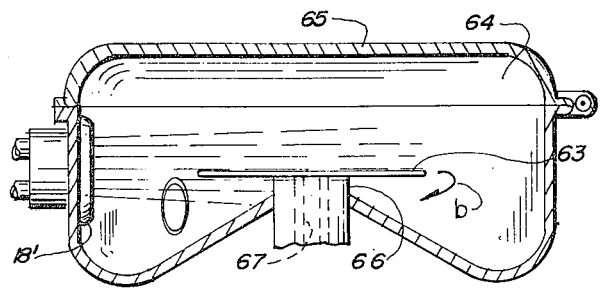
FIG. 7 is a section view taken approximately at 7—7 of FIG. 6 with the cover closed.

In the modified form illustrated in FIGS. 6 and 7, a single substrate or wafer 63 is confined in a processing chamber 64 defined by a housing 65, and is supported on a mounting pedestal 66, and retained on a rotatable vacuum chuck 67 to be rotated as indicated by arrow b. The housing 65 has separate chemical spray posts or heads 18', 19' and rinsing water spray post or head 20', each connected with respective liquid supply lines and gas supply lines as described in connection with FIGS. 1–5. Although only one substrate 63 is being processed in the chamber 64, the spray patterns 21' and 22' emanate from sources which are spaced apart around the periphery of the chamber wall, and the direction of the spray patterns 21' and 22' are at oblique angles with respect to each other as described in connection with FIG. 1. The spray patterns sweep across the wafer 63 and traverse each other to thoroughly mix with each other as they are being applied to the single wafer 63.

It will be seen that the present invention supplies chemical wafers into a processing chamber for processing substrates, and supplies single chemicals to separate spray posts in the chamber for projecting such single chemicals toward, onto and across the substrates being processed and wherein the spray patterns traverse each other at an oblique angle to clearly mix the separate chemicals. As a result, the reactivity of the chemicals enhances the removal of contaminants and other chemical layers and particulate from the faces of the substrates. Because the chemicals are mixed with each other at the last possible moment as they are applied to the faces of the substrates, the danger of the reaction in mixing the two chemicals is minimized because the mixing occurs at the last instant and in the vented chamber. Furthermore, there is minimum possibility of degrading of chemicals which may be caused by mixing in certain instances.

I claim:

1. A method of mixing liquid chemicals that are highly reactive with one another and used in a step for processing a multiplicity of substrates in an acid processing system, and consisting in
   confining a multiplicity of substrates in a closed but vented processing chamber in confronting, spaced and aligned relation to each other,
   directing a first directional spray of a first liquid chemical and from a first spray source onto the substrate in the chamber, and
   simultaneously directing a second directional spray of a second liquid chemical and from a second spray source onto the substrates in the chamber, said first and second sprays being directed at oblique angles with respect to each other and traversing each other and being directed toward and mixed at said multiplicity of substrates and thereby thoroughly mixing together while being applied to the substrates.

2. A method according to claim 1 wherein said substrates are silicon wafers.

3. A method according to claim 1 wherein the substrates are wafers, and arranging the wafers in the chamber to be in aligned, face to face, and spaced relation with each other, and directing both the first spray source and the second spray source to emanate sprays between and across all of the wafers.

4. A method of mixing liquid chemicals that are highly reactive with one another and used in a step for processing substrates in an acid processing system, and consisting in
   confining at least one such substrate wherein said substrate is a silicon wafer, in a closed but vented processing chamber,
   directing a first directional spray of a first liquid chemical and from a first spray source onto the substrate in the chamber, and
   simultaneously directing a second directional spray of a second liquid chemical and from a second spray source onto the substrate in the chamber, the first and second sprays being directed at oblique angles with respect to each other and traversing each other at the substrate and thereby thoroughly mixing together while being applied to the substrate.

5. A method according to claim 4 and orienting the silicon wafer substrate and first and second directional sprays relative to each other to cause the directional sprays to sweep across and over a face of the silicon wafer substrate.

6. A method according to claim 4 wherein the wafer substrate is round and directing said first and second sprays across the silicon wafer substrate periphery and transversely across diameters of the round wafer substrate and extending transversely of the direction of the sprays.

7. A method of mixing liquid chemicals that are highly reactive with on another and used in a step for processing wafer-shaped substrates in an acid processing system, said wafer-shaped substrates being of a material to be processed in such a system in the manufacture of electronic devices, and consisting in
   confining at least one such wafer-shaped substrate in a closed but vented processing chamber,
   directing a first directional spray of a first liquid chemical from a first spray source onto the wafer-shaped substrate in the chamber, and
   simultaneously directing a second directional spray of a second liquid chemical and from a second spray source onto the substrate in the chamber, the first and second sprays being directed at oblique angles with respect to each other and traversing each other at the substrate and thereby thoroughly mixing together while being applied to the wafer-shaped substrate.

8. A method according to claim 7 wherein the wafer-shaped substrate is round, and revolving the substrate in the chamber about an axis extending substantially normal and substantially through the center of the round wafer.

9. An apparatus for applying processing chemicals to substrates in an acid processing system, the substrates being wafers, comprising an enclosure means defining a vented processing chamber and having locating means carrying a plurality of the wafer substrates in an elongate cluster wherein the substrates confront each other in spaced relation, a pair of liquid chemical spray posts fixedly mounted on the enclosure means and spaced from each other, the spray posts being differently oriented to project sprays in different directions and toward the locating means and onto the wafer substrates, the sprays traversing each other for thorough mixing of the liquid chemicals as the sprays are applied to the substrates, and the spray posts being elongate and projecting an array of sprays all along the cluster of substrates and in directions to pass between all adjacent substrates, and supply means connected with said spray posts and simultaneously supplying separate liquid chemicals to respective spray posts.

10. An apparatus according to claim 9 wherein the locating means revolves the substrates in the chamber, and the spray posts projecting the sprays substantially normal to the axis of rotation of the substrates.

11. An apparatus according to claim 9 and the supply means also supplying inert gas to both of the spray posts, the spray posts having jetting means receiving and jetting the inert gas into the liquid sprays and atomizing the sprays directed toward and mixed at the substrates.

12. An apparatus according to claim 9, wherein the substrates is a substantially circular wafer, and the spray posts projecting the sprays substantially normal to the axis of the substrates on the locating means.

* * * * *